United States Patent
Takasu

(10) Patent No.: US 7,573,278 B2
(45) Date of Patent: Aug. 11, 2009

(54) SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/810,766

(22) Filed: Jun. 7, 2007

(65) Prior Publication Data

US 2007/0290709 A1     Dec. 20, 2007

(30) Foreign Application Priority Data

Jun. 14, 2006   (JP)   .............................. 2006-164280

(51) Int. Cl.
*G01R 31/02*   (2006.01)
*G01R 31/26*   (2006.01)

(52) U.S. Cl. .................... 324/754; 324/765; 324/158.1; 438/17

(58) Field of Classification Search .................. 257/48; 324/754–765; 438/14–17

See application file for complete search history.

(56) References Cited

U.S. PATENT DOCUMENTS

2007/0170937 A1 *   7/2007   Endou et al. ................. 324/754

FOREIGN PATENT DOCUMENTS

JP           356088333      *   7/1981   .................. 438/17

* cited by examiner

*Primary Examiner*—Ha Tran T Nguyen
*Assistant Examiner*—Emily Y Chan
(74) *Attorney, Agent, or Firm*—Adams & Wilks

(57) ABSTRACT

A semiconductor device comprises IC chips, each having semiconductor elements and pad regions, formed on a substrate, and conductor patterns for detecting displacement of a probe needle during a probing test of the IC chips. The conductor patterns each have an inner conductor and an outer conductor disposed in spaced-apart concentric relationship to one another, and the conductor patterns may be formed on the IC chips or on the substrate in a scribe region between adjacent IC chips. The distance between the inner and outer conductors is smaller than the size of the point or end tip of the probe needle. During a probing test, the probe needle is placed in contact with only the inner conductor, and slight displacement of the probe needle such that it moves into contact with both the inner and outer conductors during the probing test is detected by measuring an electricl characteristic between the two conductors so that corrective action can be taken.

15 Claims, 4 Drawing Sheets

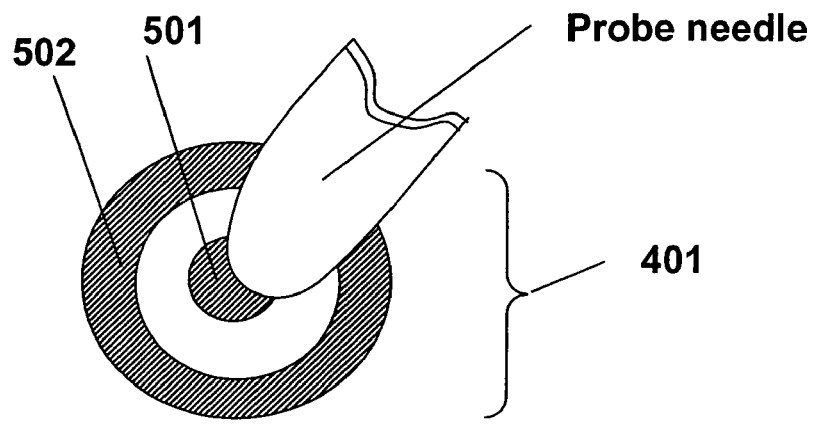
FIG. 3A
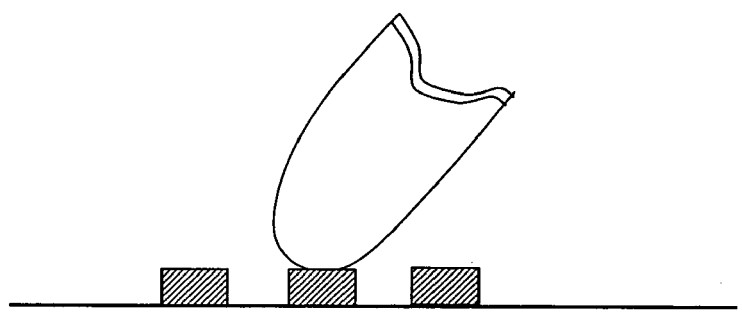
FIG. 3B
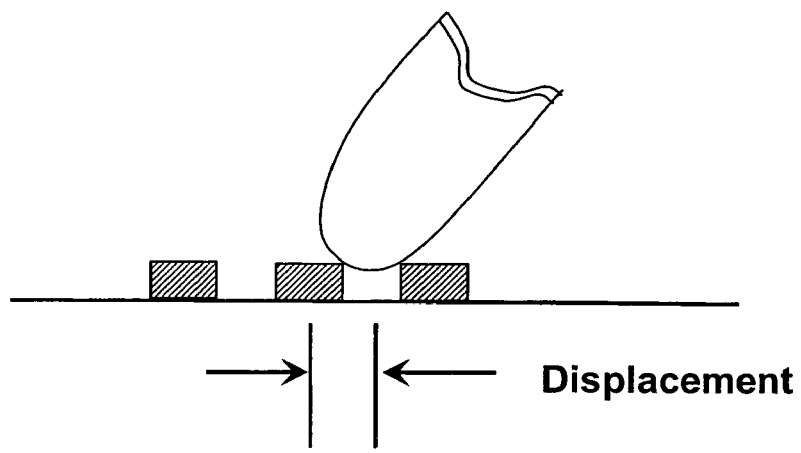
FIG. 3C

SEMICONDUCTOR DEVICE

BACKGROUND OF THE INVENTION

1. Field of the Invention

The present invention relates to detection patterns for detecting displacement of a probe in operation attached to a semiconductor device having a plurality of IC chips formed on a silicon substrate and formed of semiconductor elements, such as a transistor, and a pad region for probing.

2. Description of the Related Art

Conventionally, a probing test is generally carried out for an ordinary IC to check electrical characteristics after manufacturing.

Further, minimizing intervals between pads used in a probing test enables chip size reduction in an IC having many pads, and is indispensable to reduce IC cost.

Though the probing test is often carried out with thin detection needles, effect of displacement of the needle is larger in an IC having many pads for probing since the pad interval is small.

It is an important theme in a probing process to detect displacement of the probing needle in advance in order to prevent possible errors. For example, JP 06-45419 A discloses a technique in which pads for detecting displacement of needles in probing are provided while carrying out measurement.

As described in the above, however, effect of displacement of the needle is larger in an IC having many pads for probing since the pad interval is small, resulting in the problems of inaccurate probing test, and capture of erroneous characteristics, and the like. In order to solve these problems, for example, a technique has been disclosed where a plurality of special pads for detecting displacement of a needle in operation are provided while carrying out measurement. However, such technique has problems of the large occupation area for pads, inability in detecting the direction of the displacement, and the like.

SUMMARY OF THE INVENTION

In order to solve, these problems, according to the present invention, a semiconductor device is structured as in the following.

Patterns for detecting displacement at probing are arranged in a scribe region adjacent to an IC chip region.

A pair of the patterns for detecting displacement at probing is provided in each one of the IC chips.

A pair of the patterns for detecting displacement at probing is provided per group of IC chips simultaneously measured in a probing process.

Further, the pattern for detecting displacement at probing is made from an inner conductor and an outer conductor arranged at a minute distance from the inner conductor both arranged on concentric circles, and the outer conductor can be divided into a plurality of parts.

With these means, a semiconductor device can be obtained having patterns for detecting displacement at probing with a small occupation area and ability in detecting not only the occurrence of displacement but also the direction of displacement.

BRIEF DESCRIPTION OF THE DRAWINGS

In the accompanying drawings:

FIGS. 3A-3C are schematic views illustrating an embodiment of a pattern for detecting displacement at probing in the semiconductor device according to the present invention.

DETAILED DESCRIPTION OF THE PREFERRED EMBODIMENTS

Figure 1:
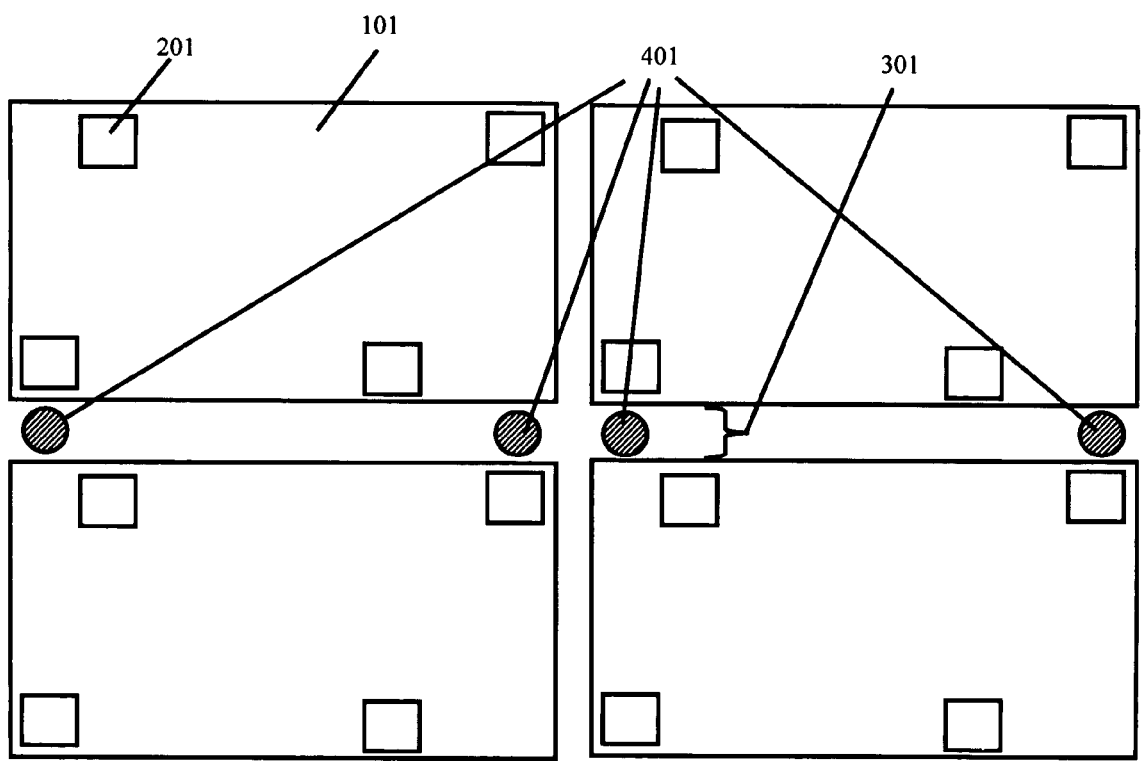
FIG. 1 is a schematic plan view illustrating a first embodiment of a semiconductor device according to the present invention.

FIG. 1 is a schematic plan view illustrating a first embodiment of a semiconductor device according to the present invention.

The semiconductor device includes a plurality of IC chips 101 and a scribe region 301. The plurality of IC chips 101 each have a plurality of pad regions 201, and the scribe region 301 is formed between the plurality of IC chips 101 and serves as a margin used in cutting out individual IC chips. Conductor patterns 401 for detecting displacement at probing are formed in the scribe region 301.

In FIG. 1, a pair of the conductor patterns 401 for detecting displacement at probing (i.e., during probe testing) is provided per IC chip 101 spacing from each other.

The patterns 401 for detecting displacement at probing are formed in pairs in order to detect displacement in a θ direction (displacement in a rotational direction of a semiconductor wafer) in probing. In order to improve the sensitivity, it is preferable that the pair of patterns 401 is arranged such that the space therebetween is as large as possible. In FIG. 1, a pair of the patterns 401 is arranged for one IC chip 101. In a simultaneous probing for a number of IC chips 101 further reduction in the area occupied by the patterns 401 for detecting displacement at probing can be made by providing a pair of the patterns 401 for the whole plurality of the IC chips 101 simultaneously probed.

Figure 2:
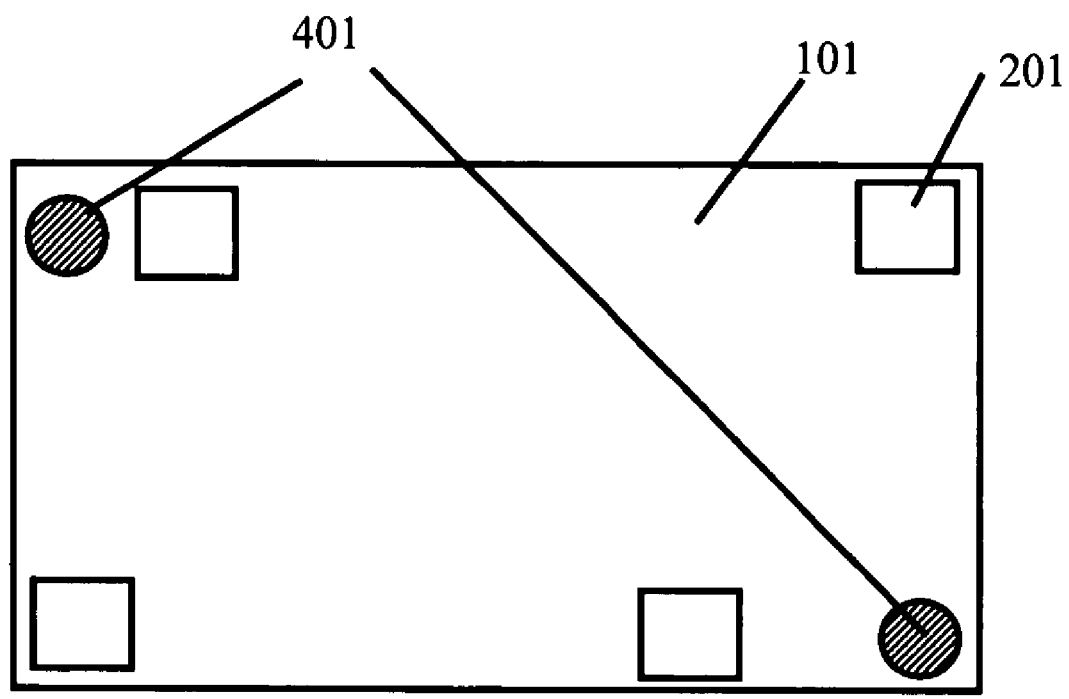
FIG. 2 is a schematic plan view illustrating a second embodiment of the semiconductor device according to the present invention.

FIG. 2 is a schematic plan view illustrating a second embodiment of the semiconductor device according to the present invention.

The second embodiment differs from the first embodiment in that the conductor patterns 401 for detecting displacement during probing are arranged in the IC chip 101 while the first embodiment illustrated in FIG. 1 has the patterns 401 in the scribe region 301.

For the sake of preventing the increase in the area of the IC chips 101 due to the area occupied by the patterns 401 for detecting displacement at probing, it is preferable to form the patterns 401 in the scribe region 301 as illustrated in FIG. 1. The patterns 401 may, however, be formed in the IC chips 101 when there is a margin both in the area of the IC chips 101 and in the manufacturing cost. With regard to other elements, the same numerals are used to designate identical members illustrated in FIG. 1, and description thereof is omitted.

FIG. 3A is schematic plan view of the pattern 401 for detecting displacement at probing in the semiconductor device according to the present invention.

The conductor pattern 401 for detecting displacement during a probing test is formed of an inner conductor 501 made of aluminum or the like and an outer conductor 502 made of aluminum or the like and arranged at a minute distance from the inner conductor 501 both arranged on concentric circles.

Here, detection of displacement at probing using the pattern 401 is described.

In a probing test, the pattern 401 for detecting displacement during probing, in which the inner conductor 501 and the outer conductor 502 of the pattern 401 for detecting displacement at probing are electrically connected to different pad regions, respectively, though not shown in figures, is probed simultaneously with ordinary pad regions.

The distance between the inner conductor 501 and the outer conductor 502 has been designed to be smaller than the size of the tip or point of a probe needle at which the needle comes into contact with the pads as shown in FIGS. 3A-3C.

Correct positioning of the probe needle causes the needle to contact only with the inner conductor 501 at a contact with the pattern 401 for detecting displacement at probing (FIG. 3B), and displacement in positioning of the probe needle causes the needle to contact with both the inner conductor 501 and the outer conductor 502 at a contact with the pattern 401 (FIG. 3C). Measuring electrical characteristic between the inner conductor 501 and the outer conductor 502, both of which are connected to different pad regions respectively, of the pattern 401 can permit judgment on the displacement of the needle.

Figure 4:
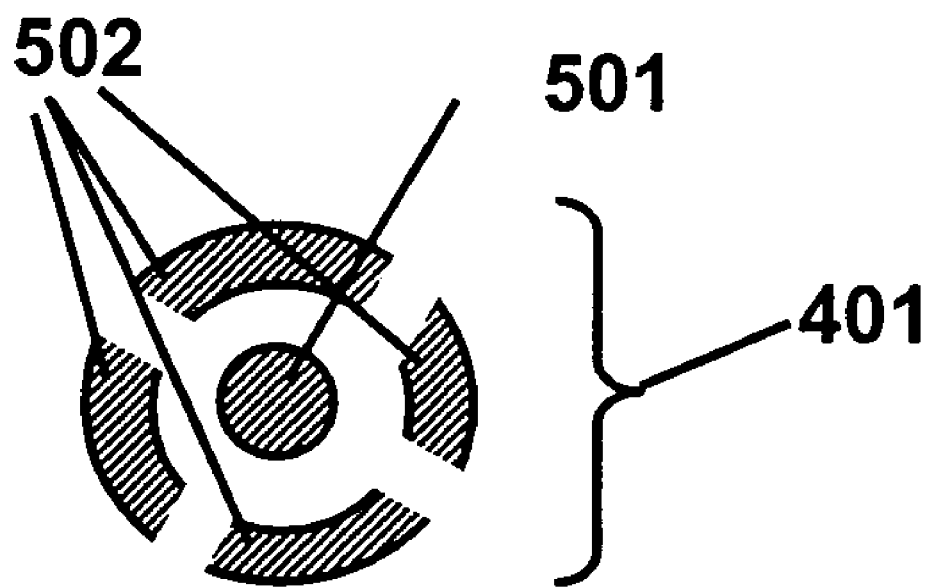
FIG. 4 is a schematic plan view illustrating another embodiment of the pattern for detecting displacement at probing in the semiconductor device according to the present invention.

FIG. 4 is a schematic plan view illustrating another embodiment of the pattern 401 for detecting displacement at probing in the semiconductor device according to the present invention.

The embodiment illustrated in FIG. 4 is different from the one illustrated in FIG. 3 in that the outer conductor 502 of the conductor pattern 401 for detecting displacement at probing is divided into a plurality of parts or sections.

Although not shown, the inner conductor 501 and the outer conductor 502 divided into the plurality of parts of the pattern 401 for detecting displacement at probing are electrically connected to different pad regions, respectively.

Similar to the case of the embodiment illustrated in FIG. 3, in probing, the pattern 401 is probed simultaneously with ordinary pad regions.

The distance between the inner conductor 501 and the outer conductor 502 has been designed to be smaller than the size of the point of the needle.

Correct positioning of the probe needle causes the needle to contact only with the inner conductor 501 at a contact with the pattern 401 for detecting displacement at probing, and displacement in positioning of the probe needle causes the needle to contact with both the inner conductor 501 and the outer conductor 502 at a contact with the pattern 401.

Detecting their electrical characteristics, direction of the displacement to the needle can be detected since the outer conductor 502 is divided into the plurality of parts which are electrically connected to different pad regions, respectively.

With regard to other elements, the same numerals are used to designate like or identical members illustrated in FIG. 3, and description thereof is omitted.

What is claimed is:

1. A semiconductor device comprising:
a silicon substrate;
a plurality of IC chips each including a transistor and a pad region formed on the silicon substrate; and
a pattern for detecting displacement of a probe needle during a probing process, the pattern comprising an inner conductor and an outer conductor arranged at a distance from the inner conductor, the inner conductor and the outer conductor being concentric with each other, and the distance between the inner and outer conductors being smaller than a tip of the probe needle, whereby the pattern is able to detect if the probe needle is displaced into simultaneous contact with both the inner and outer conductors during the probing process.

2. A semiconductor device according to claim 1, wherein the outer conductor is divided into a plurality of spaced-apart parts.

3. A semiconductor device according to claim 2, wherein the inner conductor and the outer conductor divided into the plurality of parts are electrically connected to different pad regions, respectively.

4. A semiconductor device according to claim 1, wherein a plurality of the patterns for detecting displacement are provided in a scribe region adjacent to the IC chips.

5. A semiconductor device according to claim 4, wherein a pair of the patterns for detecting displacement are provided in each one of the IC chips.

6. A semiconductor device according to claim 4, wherein a pair of the patterns for detecting displacement is provided per a group of the IC chips simultaneously measured in a probing process.

7. A semiconductor device according to claim 1, wherein a pair of the patterns for detecting displacement are provided in each one of the IC chips.

8. A semiconductor device according to claim 1, wherein the inner conductor and the outer conductor are electrically connected to different pad regions, respectively.

9. A semiconductor device comprising:
a plurality of IC chips formed on a substrate, each IC chip including semiconductor elements and pad regions; and
conductor patterns formed on the substrate or on the IC chips for detecting displacement of a probe needle during a probing test, each conductor pattern comprising an inner conductor and an outer conductor disposed in spaced-apart concentric relationship to one another with the inner and outer conductors spaced apart a distance smaller than a tip of the probe needle, whereby the conductor pattern is able to detect if the probe needle is displaced into simultaneous contact with both the inner and outer conductors during the probing test.

10. A semiconductor device according to claim 9; wherein the outer conductor comprises a plurality of spaced-apart conductor sections.

11. A semiconductor device according to claim 10; wherein the spaced-apart conductor sections define a circular shape.

12. A semiconductor device according to claim 11; wherein the inner conductor has a circular shape.

13. A semiconductor device according to claim 9; wherein the inner and outer conductors each have a circular shape.

14. A semiconductor device according to claim 9; wherein pairs of the conductor patterns are formed on a scribe region of the substrate adjacent to the IC chips.

15. A semiconductor device according to claim 9; wherein pairs of the conductor patterns are formed on each IC chip.

* * * * *